United States Patent
Lu et al.

(10) Patent No.: US 8,154,252 B2
(45) Date of Patent: Apr. 10, 2012

(54) SYSTEM AND METHOD FOR MONITORING THE STATE OF CHARGE OF A BATTERY

(75) Inventors: Wenzhe Lu, Dublin, OH (US); Simon Clegg, Stroud (GB); Ian Leonard, Oxford (GB)

(73) Assignee: Vanner, Inc., Hilliard, OH (US)

( * ) Notice: Subject to any disclaimer, the term of this patent is extended or adjusted under 35 U.S.C. 154(b) by 263 days.

(21) Appl. No.: 12/414,658

(22) Filed: Mar. 30, 2009

(65) Prior Publication Data
US 2009/0243556 A1    Oct. 1, 2009

Related U.S. Application Data

(60) Provisional application No. 61/040,885, filed on Mar. 31, 2008.

(51) Int. Cl.
*H02J 7/00* (2006.01)
(52) U.S. Cl. .................................. 320/132; 320/162
(58) Field of Classification Search .............. 320/132, 320/149; 324/427, 429–434, 132, 149, 160, 324/162
See application file for complete search history.

(56) References Cited

U.S. PATENT DOCUMENTS

| | | | |
|---|---|---|---|
| 6,424,157 B1 * | 7/2002 | Gollomp et al. | 324/430 |
| 6,456,043 B1 | 9/2002 | Finger | |
| 6,549,014 B1 * | 4/2003 | Kutkut et al. | 324/426 |
| 6,646,419 B1 * | 11/2003 | Ying | 320/132 |
| 6,841,974 B2 | 1/2005 | Dykeman | |
| 7,528,579 B2 * | 5/2009 | Pacholok et al. | 320/145 |
| 2005/0151513 A1 | 7/2005 | Cook et al. | |
| 2006/0049797 A1 | 3/2006 | Hope et al. | |
| 2006/0232240 A1 | 10/2006 | Salasoo et al. | |
| 2007/0239374 A1 | 10/2007 | Dougherty et al. | |
| 2007/0252600 A1 | 11/2007 | Chou et al. | |
| 2009/0015202 A1 * | 1/2009 | Miura | 320/132 |

OTHER PUBLICATIONS

Solidstate Controls, Inc., "Battery Management System," Product specification note, p. 1-4, Dec. 2002 (abstract) [online]. Retrieved from the Internet on [Nov. 1, 2009]. http://www.solidstatecontrolsinc.com/products/pdf/bms2000v.pdf.

* cited by examiner

*Primary Examiner* — Huy Q Phan
*Assistant Examiner* — Alesa Allgood
(74) *Attorney, Agent, or Firm* — James R. Eley; Michael A. Forhan; Eley Law Firm Co. LPA

(57) ABSTRACT

A process for monitoring the status of a battery. Steps of the process include measuring a battery current and comparing the battery current to a predetermined threshold. A battery status is determined as one of charging, discharging and quiescent. For a battery charging status determination, the charging state of charge of the battery is computed. For battery discharge status determination, the discharge current is compared to a predetermined threshold. Based upon the discharge current comparison, a basis for the discharge current is selected from one of a plurality of predetermined discharge conditions and the discharging state of charge of the battery is computed for the select discharge condition. For a quiescent status, the quiescent state of charge of the battery is computed. The computed state of charge of the battery is provided in a quantitative form.

14 Claims, 9 Drawing Sheets

SYSTEM AND METHOD FOR MONITORING THE STATE OF CHARGE OF A BATTERY

This application claims priority to U.S. provisional patent application No. 61/040,885, filed Mar. 31, 2008, the contents of which are hereby incorporated by reference.

FIELD

The present invention relates generally to battery charging systems and methods, in particular to systems and methods for monitoring the state of charge of a battery and adjusting the charging characteristics to match to the state of charge.

BACKGROUND

A typical vehicle power system consists of a battery, an alternator to charge the battery and to augment power supplied by the battery, and one or more distribution buses. The power system is primarily utilized to start a prime mover, such as an internal combustion engine, and to power a variety of loads connected to the distribution bus. There is a desire on the part of many vehicle manufacturers to increase the "electrification" of vehicles, i.e., reducing the number of accessories that depend directly on the internal combustion engine as a mechanical prime mover. Example accessories include power steering pumps, hydraulic drives, engine cooling fans, air conditioning compressors, oil and coolant pumps, and air compressors. Advantages of accessory electrification include a reduction in engine loading, which facilitates greater engine performance, increased flexibility in locating and mounting the accessories in the vehicle, reduced fuel consumption, more efficient accessory operation made possible by optimizing the location and wiring of the accessories, and reduced vehicle emissions corresponding to reduced engine loading and fuel consumption.

Some vehicles may have several battery power supplies. For example, a vehicle may have a first battery system for operating a starter to start the internal combustion engine and a second battery system for powering accessories. The discharge and load characteristics can vary considerably between the cranking and accessory batteries. For example, the cranking batteries are intended to provide high current for a relatively short period of time to start the engine, while the accessory batteries are used to provide a smaller amount of current to the vehicle's accessories for a relatively longer period of time. The types of batteries used for cranking and for powering accessories may also differ. For example, a cranking battery may use flooded lead-acid batteries while the accessory battery may use deep-cycle absorbed glass mat ("AGM") batteries. Each type of battery can have differing charge requirements, as well.

As a consequence of the foregoing it is important that the battery be charged in a manner conducive to satisfactory battery life. It is also important to charge the battery in an efficient manner, so as to maintain a high overall vehicle operating efficiency.

SUMMARY

A system and method for monitoring the state of charge ("SOC") of a battery is disclosed according to an embodiment to the present invention. The state of charge of a given battery, which is its available capacity expressed as a percentage of its rated capacity, is monitored. The SOC is used to calculate how much longer the battery will continue to perform before it needs recharging. The SOC is also utilized to determine efficient charging characteristics for charging the battery.

One embodiment of the invention may be a process for monitoring the status of a battery. Steps of the process include measuring a battery current and comparing the battery current to a predetermined threshold. A battery status is determined as one of charging, discharging and quiescent. For a battery charging status determination, the charging state of charge of the battery is computed. For battery discharge status determination, the discharge current is compared to a predetermined threshold. Based upon the discharge current comparison, a basis for the discharge current is selected from one of a plurality of predetermined discharge conditions and the discharging state of charge of the battery is computed for the select discharge condition. For a quiescent status, the quiescent state of charge of the battery is computed. The computed state of charge of the battery is provided in a quantitative form.

Another embodiment of the present invention may be a system for monitoring the status of a battery. The system comprises a battery, a charger configured to charge the battery, a controller to control the charging operation of the charger, signal inputs from the battery to the monitoring portion of the controller, and a load coupled to the battery. A monitoring portion monitors the state of the battery. The monitoring portion is configured to compare the battery current to a predetermined threshold; determine, from the battery current comparison, the battery status as one of charging, discharging and quiescent; for a battery charging status determination, compute the charging state of charge of the battery; for battery discharge status determination, compare the discharge current to a predetermined threshold, selecting, based upon the discharge current comparison, a basis for the discharge current from one of a plurality of predetermined discharge conditions, and compute the discharging state of charge of the battery for the select discharge condition; for quiescent status, compute the quiescent state of charge of the battery. The computed state of charge of the battery is provided in a quantitative form.

BRIEF DESCRIPTION OF THE DRAWINGS

Further features of the inventive embodiments will become apparent to those skilled in the art to which the embodiments relate from reading the specification and claims with reference to the accompanying drawings, in which:

DETAILED DESCRIPTION

Figure 1:
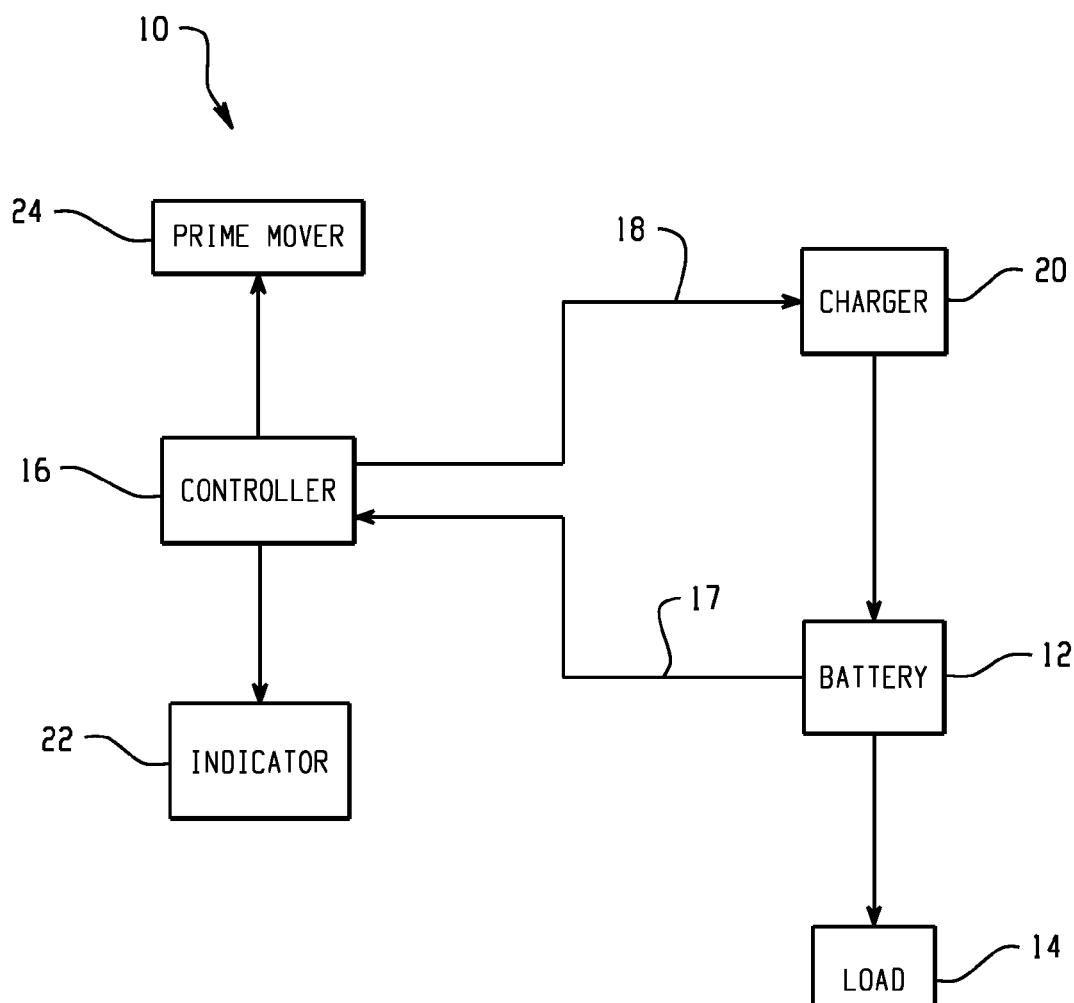
FIG. 1 is a block diagram showing the general arrangement of a system for monitoring the state of charge of a battery.

The general arrangement of a system 10 for monitoring the state of charge of a battery is shown in FIG. 1. In system 10 a battery 12 (which may be a single battery or a plurality of batteries wired in series and/or parallel) provides electrical power to one or more loads 14, such as engine controls and accessories connected to a vehicle electrical system. The state of charge of battery 14 is monitored by a controller 16 via signal inputs 17. Signal inputs 17 may include voltage and/or current measurements for battery 12 and/or individual cells making up the battery. Controller 16 may provide predetermined control signals 18 to a charger 20 corresponding to the state of charge of battery 14, thereby causing the charger to provide a determinable charging signal to the battery in order to restore the battery to a predetermined state of charge.

Controller 16 may be realized using any combination of analog and/or digital electronic control architecture now known or later developed. For example, controller 16 may be any conventional microprocessor, microcomputer, computer, or programmable logic device and may include a predetermined set of instructions, such as a computer program, in a memory portion. The instructions allow system 10 to function in accordance with a predetermined set of criteria, rules and algorithms. A control signal 18 may be provided to charger 20 by controller 16. The control signal may take any conventional form, such as analog or digital signals, including proprietary and standardized serial and parallel data buses.

Controller 16 may include a monitoring portion directed to monitoring the state of the battery 12 and providing status indications used by the instructions to generate the aforementioned control signal. In some embodiments of the present invention the monitoring portion may be separate from controller 16. In addition, some embodiments may or may not provide status indications to the controller.

Charger 20 may be any conventional type of battery charger using any combination of analog and/or digital electronic control architecture, now known or later developed, to provide a predetermined charging signal to battery 12 to restore the state of charge of the battery to a predetermined level. The charging signal may comprise a determinable voltage and/or current provided to battery 12 in analog and/or digital form.

FIGS. 2A through 2G describe an example method for monitoring the state of charge of a battery according to an embodiment of the present invention. In FIGS. 2A through 2G positive values are used to represent charging current and negative values are used to represent discharging current. Charging and discharging thresholds are used to determine the operating mode of the battery. When battery current is greater than charging threshold (thC), it is in charging mode. When battery current is smaller than discharging threshold (thD), it is in discharge mode. Otherwise it is considered to be in quiescent mode.

Figure 2A:
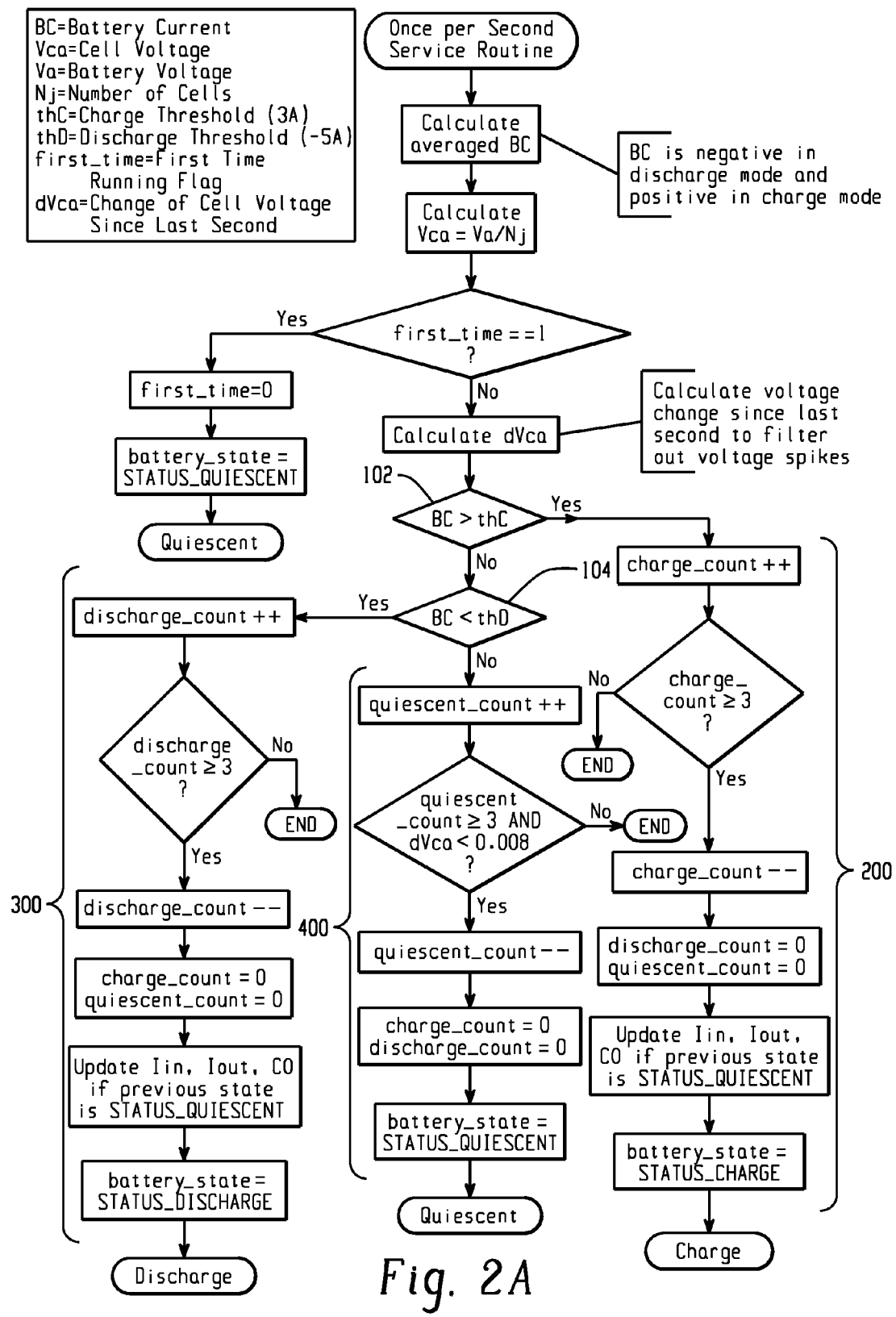
FIG. 2A is a flow diagram describing a system and method for monitoring the state of charge of a battery according to an embodiment of the present invention.
Figure 2B:
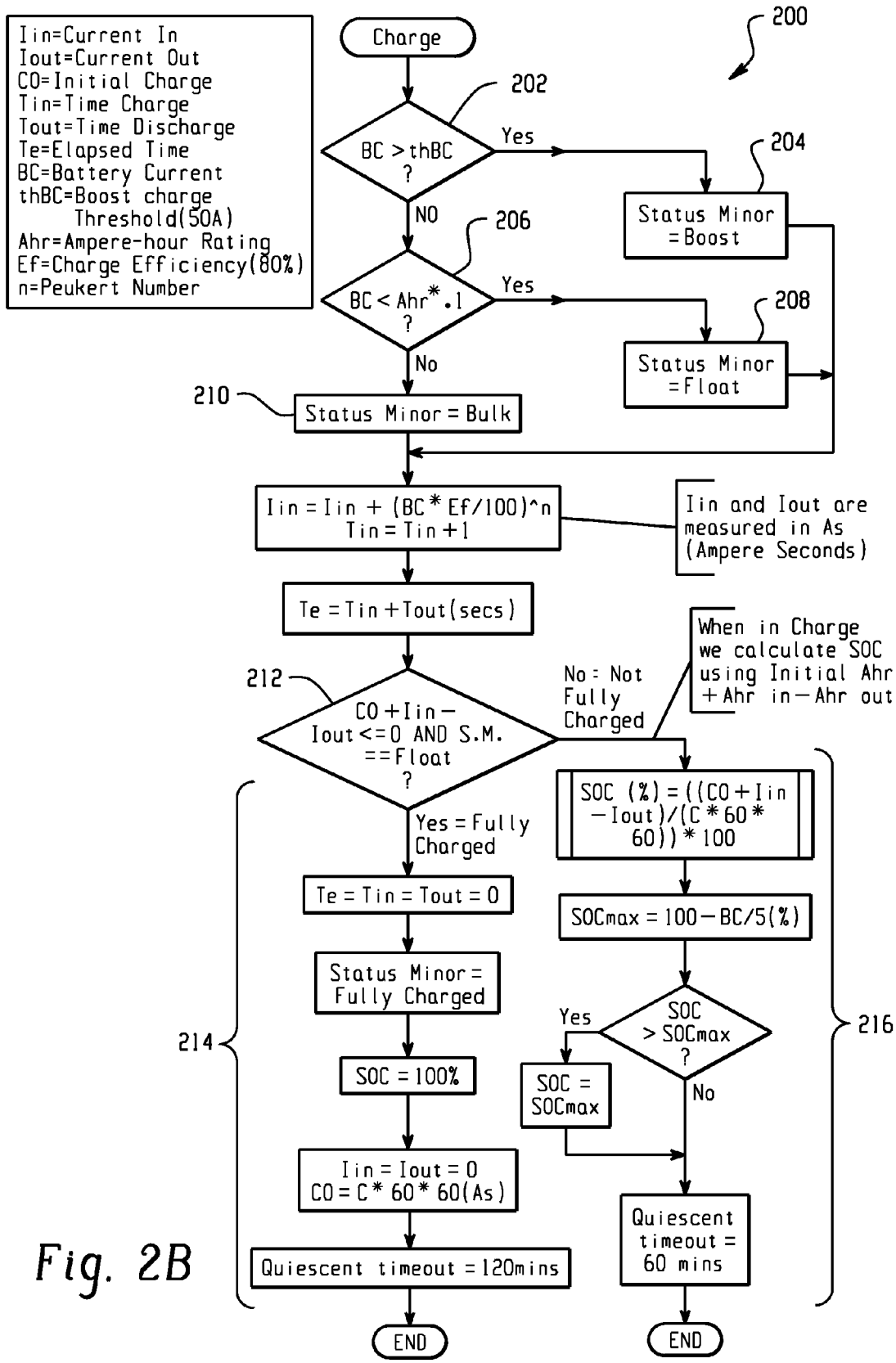
FIG. 2B is a continuation of the flow diagram of FIG. 2A.
Figure 2C:
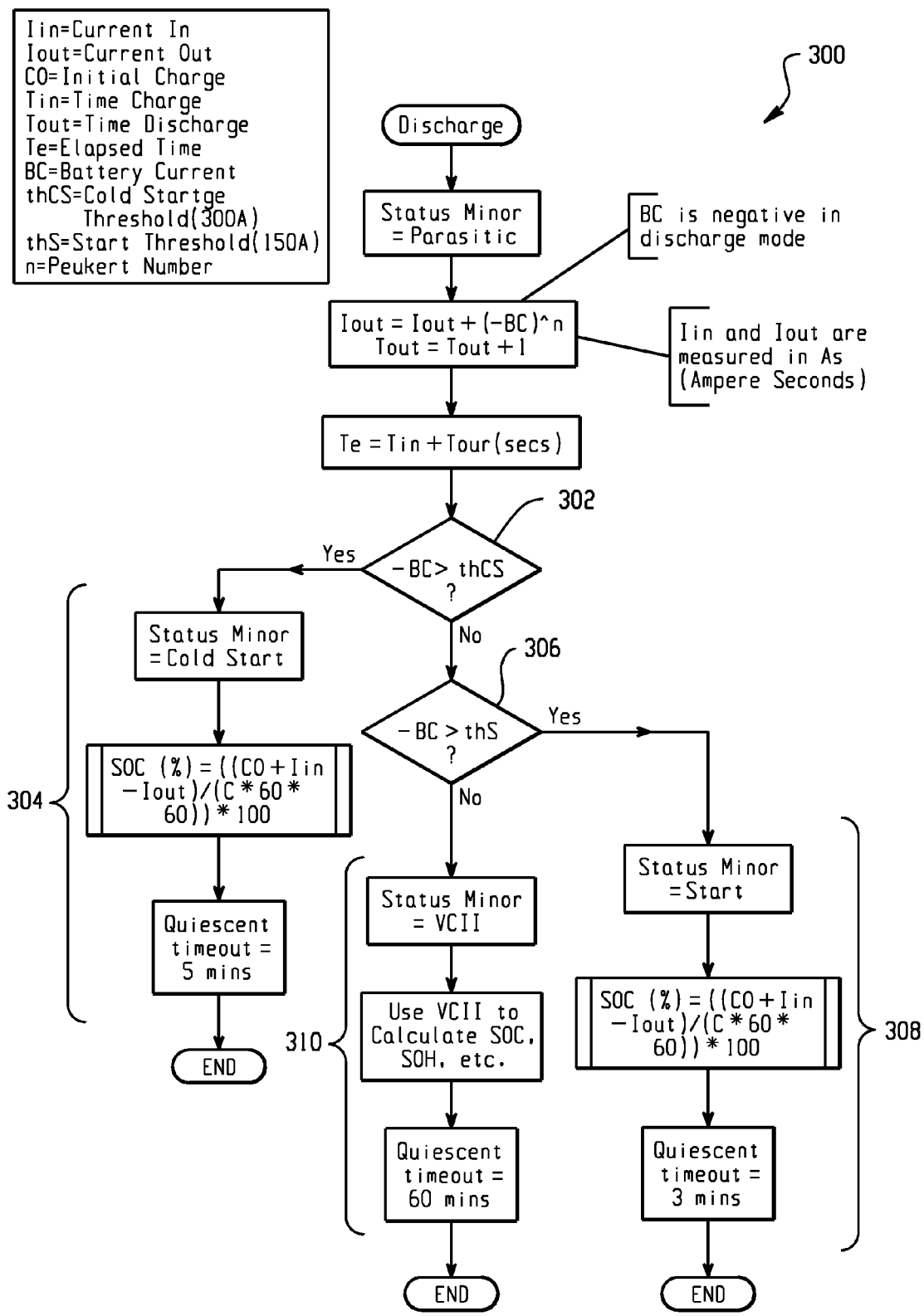
FIG. 2C is another continuation of the flow diagram of FIG. 2A.
Figure 2D:
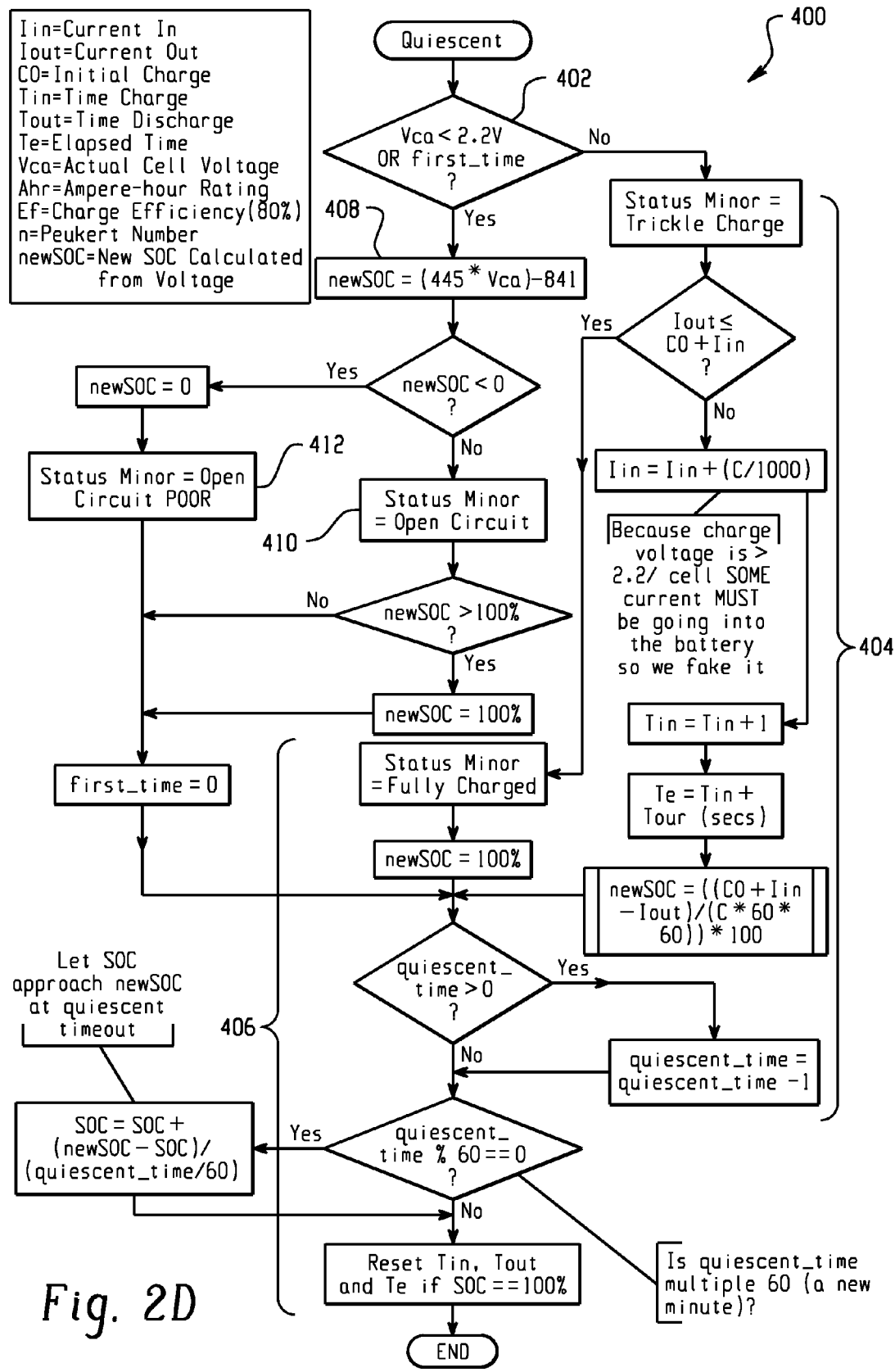
FIG. 2D is still another continuation of the flow diagram of FIG. 2A.

With general reference to FIGS. 2A-2G it can be seen that the system and method for monitoring the state of charge of a battery includes three modes of battery operation: charging mode (FIG. 2B), discharging mode (FIG. 2C) and quiescent mode (FIG. 2D). As will be detailed further below, in the various modes different algorithms are used to estimate the state of charge (SOC) of a battery.

With reference to FIG. 2A, the appropriate operating mode of the system is determined. At 102 a battery current "BC" is compared to a predetermined threshold charge value "thC." If the battery current exceeds the threshold value a charge mode 200 is entered. Conversely, at 104 the battery current is compared to a predetermined discharge threshold value "thD." If the battery current is below the threshold value a discharge mode 300 is entered. If the battery current is between thresholds thC and thD a quiescent mode 400 is entered.

Details of charge mode 200 are shown in FIG. 2B, with additional reference to FIG. 1. At 202 the battery 12 current BC is compared to a predetermined battery current boost charge threshold value "thBC." If the battery 12 current exceeds the threshold value thBC the system 10 indicates a boost mode charge cycle 204. In boost charging mode charger 20 increases the voltage it applies to battery 12 to a predetermined level in order to achieve a desired, predetermined charging current.

At 206 the battery current BC is compared to a predetermined fraction of the amp-hour rating "Ahr" for the battery. If the battery 12 current is below this threshold value a float mode charge cycle 208 is indicated. In float charging mode only a small amount of charging current is applied to battery 12 by charger 20, the charging current being sufficient to overcome internal discharge losses of the battery.

If the battery current is between thresholds thBC and Ahr a bulk charge mode 210 is indicated. In bulk charging mode charger 20 supplies the maximum available charging current or maximum voltage that the charger is capable of delivering to the battery 12.

With continued reference to FIG. 2B, step 212 determines whether or not battery 12 is fully charged. If so, steps 214 collectively control the operation of charger 20 in quiescent mode, detailed further below, for a predetermined period of time. If not, steps 216 collectively control charging of battery 12 and monitor the SOC of the battery, switching to quiescent mode for a predetermined period of time when a predetermined maximum SOC is reached.

In charging mode, Peukert's equation is used to calculate SOC, using Equations 1, 2 and 3 below:

$$Cin = ((Iin * Ef/100)^n) * Tin \qquad \text{Equation 1}$$

$$Cout = ((-Iout)^n) * Tout \qquad \text{Equation 2}$$

$$SOC = (C0 + Cin - Cout)/Cbatt \qquad \text{Equation 3}$$

where "in" is defined as charge, and "out" is defined as discharge. I is charging/discharging current in Amps, T is charging/discharging time in hours, C is the Peukert capacity of battery (with C0 as initial capacity and Cbatt as rated battery capacity) in Amp-hours, and n is Peukert's exponent for that particular battery type. C0 is calculated from the SOC of the previous mode from which it is transited.

With continued reference to FIG. 1, FIG. 2C shows details of battery 12 discharge monitoring 300 with system 10. At 302 the battery discharge current "-BC" is compared to a cold start threshold "thCS" to establish a basis for the discharge, such as an example embodiment wherein load 14 is a starter motor for a prime mover for a vehicle. If the discharge current exceeds the threshold "cold start," steps collectively labeled 304 are executed to monitor charging of battery 12 and monitor the SOC of the battery, switching to quiescent mode for a predetermined period of time when a predetermined maximum SOC is reached.

At 306 battery discharge current is compared to a start threshold "thS." If the discharge current exceeds this threshold the steps collectively labeled 308 are executed to monitor charging of battery 12 and monitor the SOC of the battery, switching to quiescent mode for a predetermined period of time when a predetermined maximum SOC is reached.

If the battery discharge current is between thresholds thCS and thS, a battery monitoring process "VCII," detailed below, is indicated.

Figure 2E:
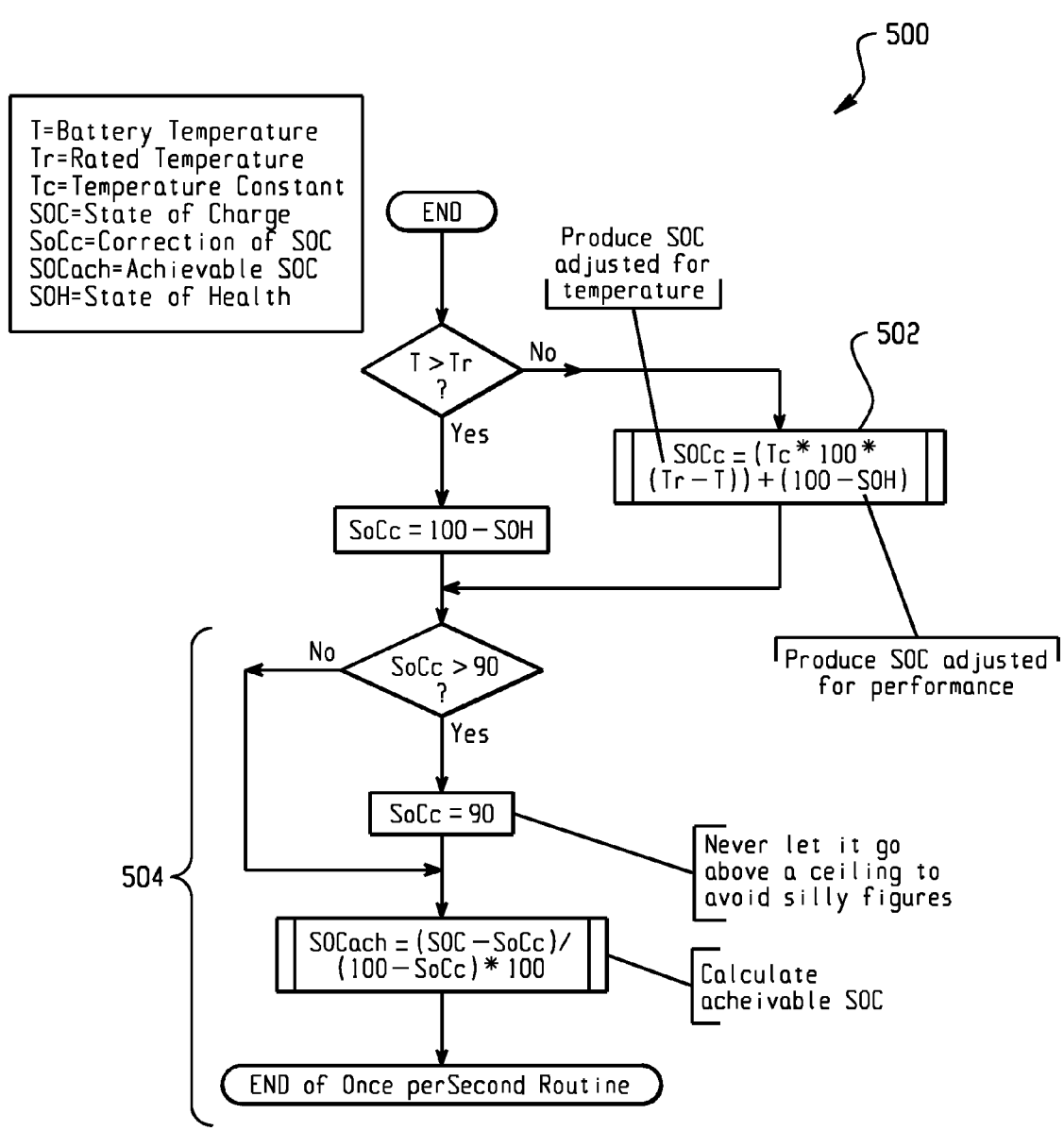
FIG. 2E is a continuation of the flow diagrams of FIGS. 2A, 2B, 2C and 2D.

In discharging mode (FIG. 2C), a combination of Peukert's equation and a virtual cell model algorithm (FIG. 2F) is used to calculate SOC, SOH (state of health), and Up (predicted time to run) of a battery. Details of virtual cell mathematical modeling techniques are described in U.S. patent application Ser. No. 11/035,609, commonly assigned with the instant application, the entire contents of which are incorporated herein by reference thereto. In any mode, the calculated SOC, SOH and Up are compensated using ambient temperature as a variable, as shown in FIG. 2E.

Quiescent mode 400 is shown in FIG. 2D according to an embodiment of the present invention. At step 402 battery 12 cell voltage "Vca" is compared to a predetermined value. If the cell voltage is greater than the predetermined value a trickle charge mode is entered, shown collectively as 404. Once battery 12 is fully charged, as at 406, a quiescent mode is entered. If Vca is less than the predetermined value a state of charge value is computed at 408. If the computed state of charge value is less than zero an "open circuit" fault is detected at 410. Conversely, if SOC equals zero a poor connection is detected at 412.

In quiescent mode 400 the battery 12 current is very small. Consequently, battery voltage is used to calculate the SOC as a percentage, using Equation 4 below:

$$SOC = (a*Vca) - b,\qquad\text{Equation 4}$$

where Vca is the actual cell voltage of battery in Volts. The two constants a and b may differ for different types of batteries.

Since different algorithms are used for different battery modes, consideration is preferably made during mode transition to avoid discontinuity of calculated SOC. When transited from any other mode to charging/discharging mode, the initial battery capacity C0 can be calculated from the SOC of the previous mode, using Equation 5 below:

$$C0 = Cbatt * SOC,\ Cin=0,\ Cout=0 \qquad\text{Equation 5}$$

This assures the SOC for the new mode will start from the value at the end of the previous mode.

Transition from any other mode to quiescent mode (FIG. 2D) is somewhat more complex. Due to the typically slow chemical reaction inside a battery, it takes some time for the battery voltage in quiescent mode to stabilize when transited from charging or discharging mode. The time needed is determined by the details of the previous mode (start, cold start, partially charged, fully charged, and so on). Before the voltage is finally stabilized, the SOC calculated from voltage is not accurate. A curve-fitting technique is used here to estimate the SOC in quiescent mode. At the beginning of the transition (from other mode to quiescent mode), the SOC is equal to the value at the end of the previous mode. Once the voltage has stabilized, the SOC is equal to the value calculated from the voltage. Between these two moments, the calculated SOC is preferably curve-fitted, using Equation 6 below:

$$SOC = oldSOC + (newSOC - oldSOC)/(time\_remained\_to\_stable\_voltage\_in\_minute) \qquad\text{Equation 6}$$

where oldSOC is the SOC from previous calculation, newSOC is the SOC calculated from voltage, and time_remained_to_stable_voltage_in_minute is the time remained for the voltage to stabilize. It is dependent on the previous mode and the time elapsed from mode transition. The SOC will approach newSOC smoothly and reach the accurate value.

A set of temperature compensation steps are shown in FIG. 2E. If the battery 12 temperature "T" is less than a predetermined rated temperature "Tr" normal charging of the battery occurs in the manner previously described, as indicated by 502. However, if the battery temperature exceeds the rated temperature an achievable state of charge under such conditions is computed in steps collectively labeled 504.

Figure 2F:
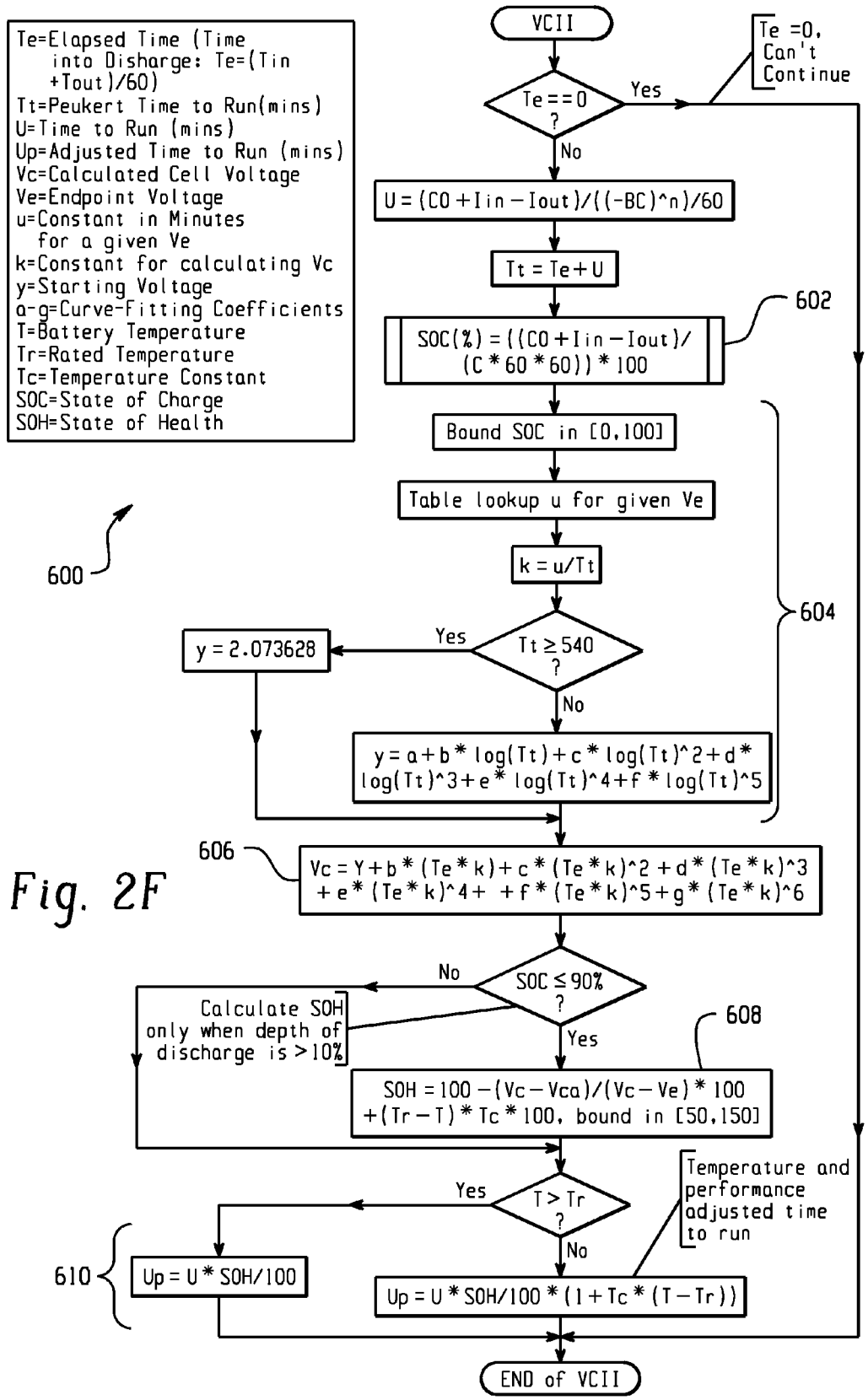
FIG. 2F is a flow diagram describing a virtual cell model algorithm of a system and method for monitoring the state of charge of a battery according to an embodiment of the present invention.

A control algorithm 600 for calculating the state of charge/state of health by means of a virtual cell computation is shown in FIG. 2F. A state of charge value is computed at 602. A starting voltage for battery 12 and charging time is then computed at collective steps 604. Battery 12 cell voltage is then calculated at 606. A state of health value "SOH" is then computed at 608. Finally, the discharging time for battery 12 is adjusted at 610, taking into account the battery's state of health and temperature.

Figure 2G:
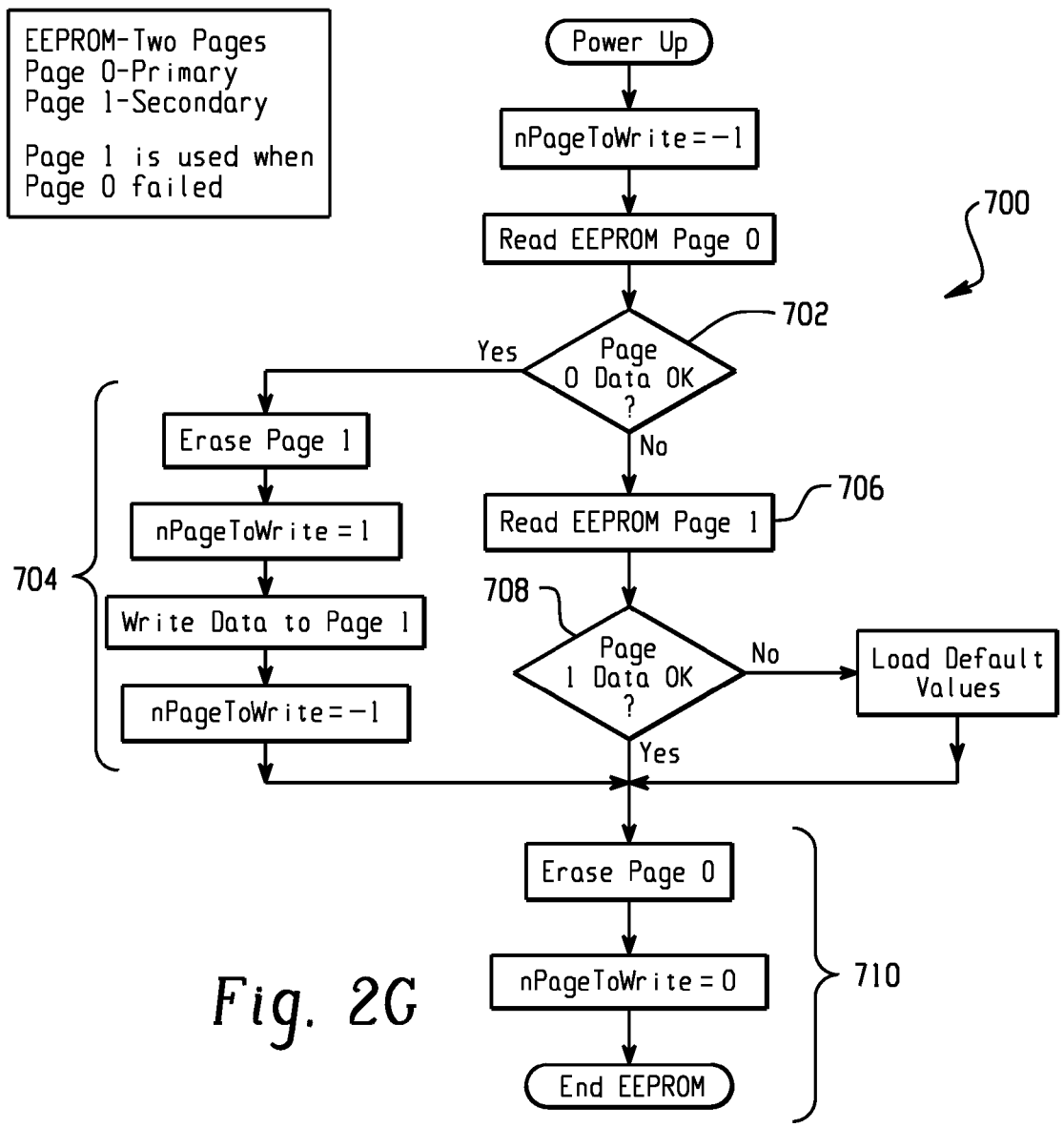
FIG. 2G is a flow diagram describing a system and method for a power-up mode of a system and method for monitoring the state of charge of a battery according to an embodiment of the present invention.

A process 700 for storing system 10 status data is shown in FIG. 2G. Data is written to two "pages," page 0 and page 1. Page 0 data is tested at 702 and, if not corrupted, page 1 data is stored at collective steps 704. If not, page 1 data is read at 706 and, if not found to be corrupted at 708, written to page 0 at 710.

Figure 2H:
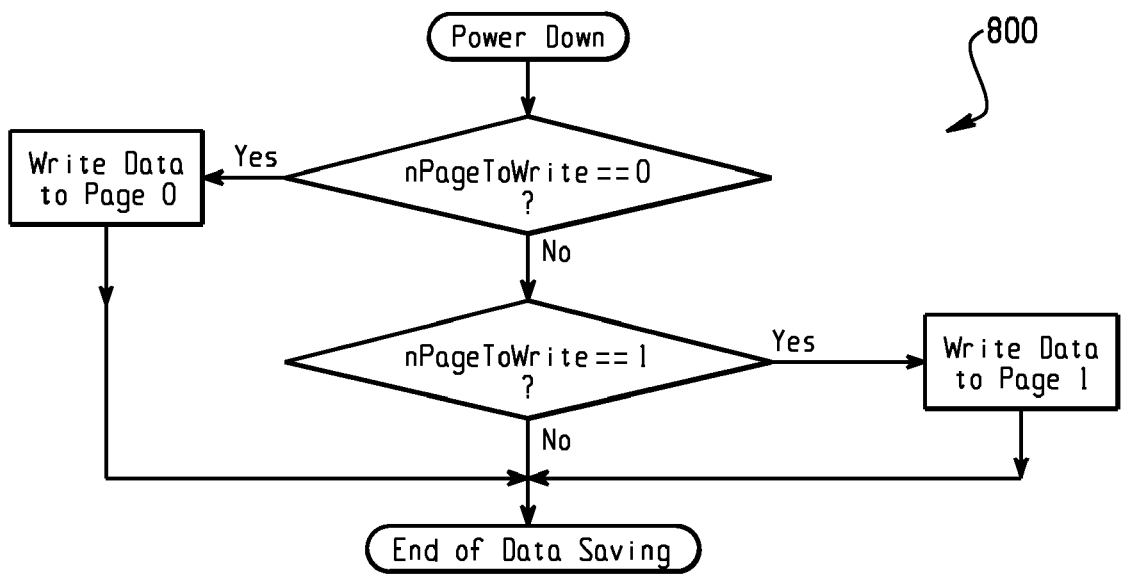
FIG. 2H is a flow diagram describing a system and method for a power-down mode of a system and method for monitoring the state of charge of a battery according to an embodiment of the present invention

A system 10 power-down process 800 is shown in FIG. 2H. During power-down system 10 status data is written to page 0 and page 1 (see FIG. 2G). With general reference to FIG. 2G, one advantage of the disclosed invention is the saving of battery data at power down. The saved data will be read and checked at power up. Thus, every time the battery-monitoring device is turned on, it can start from the previous state of battery instead of resetting everything to a default condition. This allows the system and method to more accurately track battery SOC.

In some embodiments of the present invention an aural or visual indication 22 (FIG. 1) regarding the state of the battery being charged may be provided to an operator.

In still other embodiments a prime mover 24 (FIG. 1) such as a vehicle engine may be automatically started to provide energy for charging the battery when the need for such a charge is detected by the system. Similarly, the prime mover may be turned off when it is determined from monitoring the state of the battery that charging is no longer needed.

Some embodiments may further include means for shedding loads 14 connected to the battery based upon the state of the battery. Load shedding may be accomplished in a predetermined manner, such as in order of a predetermined lowest to highest priority, for example.

While this invention has been shown and described with respect to a detailed embodiment thereof, it will be understood by those skilled in the art that changes in form and detail thereof may be made without departing from the scope of the claims of the invention. For example, although the invention described herein is directed to monitoring the state of a battery under charge, it is readily apparent that the invention may be implemented in the form of an apparatus to control the operation of charger 20 (FIG. 1) in a predetermined manner, such as tailoring the bulk, boost and float charging modes to the state of charge and/or state of health of battery 12, as well as the demands imposed upon battery 12 by load 14.

What is claimed is:

1. A process for monitoring the status of a battery, comprising the steps of:
    measuring a battery current;
    comparing the battery current to a predetermined threshold;

determining, from the battery current comparison, the battery status as one of charging, discharging and quiescent;

for a battery charging status determination, computing the charging state of charge of the battery;

for battery discharge status determination, comparing the discharge current to a plurality of predetermined thresholds, selecting, based upon the result of the discharge current comparison, a basis for the discharge current from one of a plurality of predetermined discharge conditions, and computing the discharging state of charge of the battery for the select discharge condition; and for quiescent status, computing the quiescent state of charge of the battery; and providing the computed state of charge of the battery in a quantitative form.

2. The process of claim 1, further comprising the step of computing the discharging state of charge of the battery using a virtual cell model.

3. The process of claim 1, further comprising the step of computing the discharging state of health of the battery using a virtual cell model.

4. The process of claim 1, for a battery charging status determination, further including the steps of comparing the battery current to a predetermined threshold, determining, from the battery current comparison, the battery charging status as one of boost charging, bulk charging and float charging.

5. The process of claim 1, for a battery charging status determination, further including the step of transitioning from charging status to quiescent status when the battery is fully charged.

6. The process of claim 1, for a battery quiescent status determination, further including the steps of monitoring for an open circuit connection and monitoring for a poor battery charging connection.

7. The process of claim 1, further including the step of adjusting the computed state of charge of the battery based upon the temperature of the battery.

8. The process of claim 1, further comprising the step of storing the computed state of charge of the battery in first and second locations.

9. The process of claim 8, further comprising the steps of:

checking the computed state of charge of the battery in the first location and, if valid, providing the computed charge of the battery stored in the first location;

checking the computed state of charge of the battery in the second location if the computed state of charge of the battery in the first location is invalid and, if valid, providing the computed charge of the battery stored in the second location; and providing a predetermined default state of charge if the computed state of charge of the battery in the first and second locations are both invalid.

10. A system for monitoring the status of a battery, comprising:

a battery;

a charger configured to charge the battery;

a controller to control the charging operation of the charger;

a plurality of signal inputs from the battery to the monitoring portion of the controller;

a load coupled to the battery; and a monitoring portion to monitor the state of the battery, the monitoring portion being configured to compare the battery current to a predetermined threshold; determine, from the battery current comparison, the battery status as one of charging, discharging and quiescent; for a battery charging status determination, compute the charging state of charge of the battery; for battery discharge status determination, compare the discharge current to a plurality of predetermined thresholds, selecting, based upon the discharge current comparison, a basis for the discharge current from one of a plurality of predetermined discharge conditions, and compute the discharging state of charge of the battery for the select discharge condition; for quiescent status, compute the quiescent state of charge of the battery; and provide the computed state of charge of the battery in a quantitative form.

11. The system of claim 10, further including at least one of an aural or visual indication regarding the state of the battery being charged.

12. The system of claim 10 wherein the computed state of charge is coupled to the controller to control the operation of the charger in a predetermined manner.

13. The system of claim 12, further including a prime mover configured to be controlled by the controller, the prime mover being started and stopped by the controller to provide energy for charging the battery in a predetermined manner.

14. The system of claim 12, further including a plurality of loads configured to be controlled by the controller, the loads being connected and disconnected from the battery based upon the state of the battery and a predetermined priority.

\* \* \* \* \*